United States Patent
Yun et al.

(10) Patent No.: US 8,524,537 B2
(45) Date of Patent: Sep. 3, 2013

(54) SEMICONDUCTOR DEVICE AND METHOD OF FORMING PROTECTIVE COATING MATERIAL OVER SEMICONDUCTOR WAFER TO REDUCE LAMINATION TAPE RESIDUE

(75) Inventors: JaEun Yun, Kyounggi (KR); HunTeak Lee, Kyungki-Do (KR); SeungYong Chai, Kyungki-Do (KR); WonJun Ko, Kyungki-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 160 days.

(21) Appl. No.: 12/771,833

(22) Filed: Apr. 30, 2010

(65) Prior Publication Data

US 2011/0266656 A1    Nov. 3, 2011

(51) Int. Cl.
*H01L 21/00* (2006.01)

(52) U.S. Cl.
USPC ............ 438/114; 438/68; 438/110; 438/113; 438/458; 438/459; 438/460; 438/462; 438/977; 438/959; 257/698; 257/738; 257/779; 257/780; 257/797; 257/E23.179

(58) Field of Classification Search
USPC ........... 438/68, 110, 113, 114, 455, 458–460, 438/462, 977, 959, 940; 257/698, 738, 779, 257/780, 797, E23.179
See application file for complete search history.

(56) References Cited

U.S. PATENT DOCUMENTS

| | | | |
|---|---|---|---|
| 6,949,158 B2 | 9/2005 | Ball et al. | |
| 2005/0070095 A1* | 3/2005 | Sharan et al. | 438/642 |
| 2007/0037319 A1* | 2/2007 | Chan et al. | 438/108 |
| 2009/0081830 A1 | 3/2009 | Omandam et al. | |
| 2009/0317945 A1* | 12/2009 | Izumi | 438/110 |
| 2010/0273312 A1* | 10/2010 | Noda | 438/462 |

\* cited by examiner

*Primary Examiner* — Meiya Li
(74) *Attorney, Agent, or Firm* — Robert D. Atkins; Patent Law Group: Atkins & Associates, P.C.

(57) ABSTRACT

A semiconductor device has a build-up interconnect structure formed over an active surface of a semiconductor wafer containing a plurality of semiconductor die separated by a saw street. An insulating layer is formed over the interconnect structure. Bumps are formed over the interconnect structure. A protective coating material is deposited over the insulating layer and saw street. A lamination tape is applied over the coating material. A portion of a back surface of the semiconductor wafer is removed. A mounting tape is applied over the back surface. The lamination tape is removed while leaving the coating material over the insulating layer and saw street. A first channel is formed through the saw street extending partially through the semiconductor wafer. The coating material is removed after forming the first channel. A second channel is formed through the saw street and the mounting tape is removed to singulate the semiconductor wafer.

28 Claims, 12 Drawing Sheets

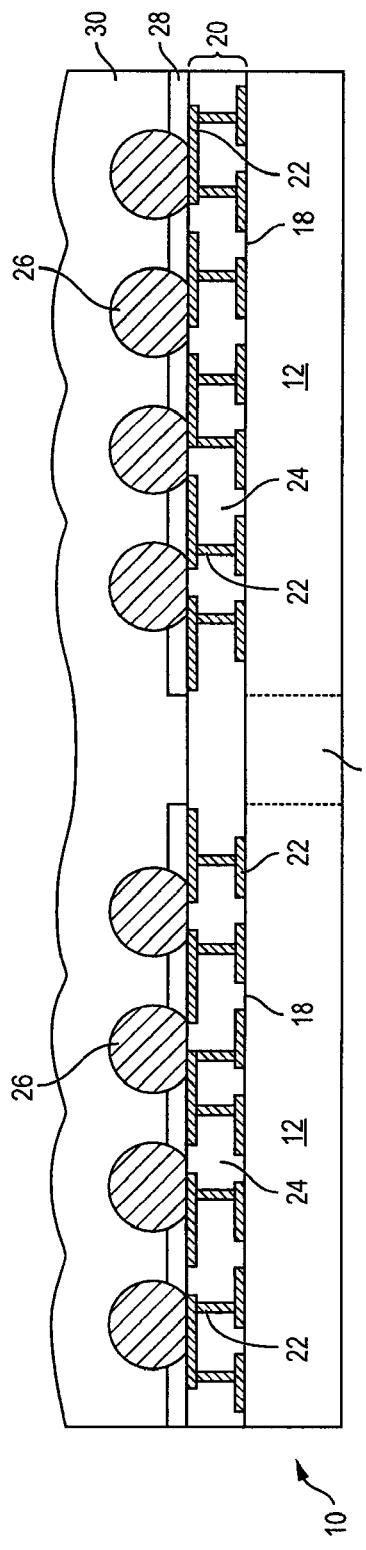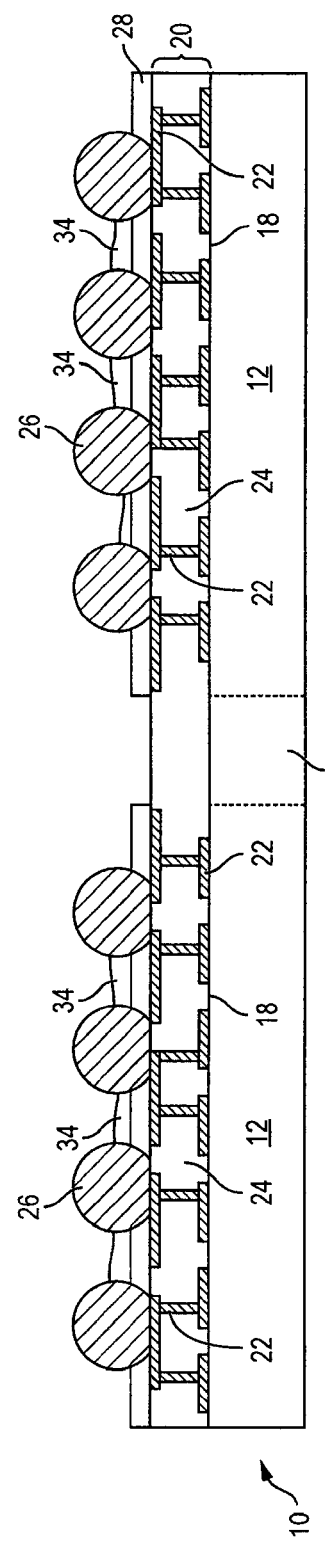

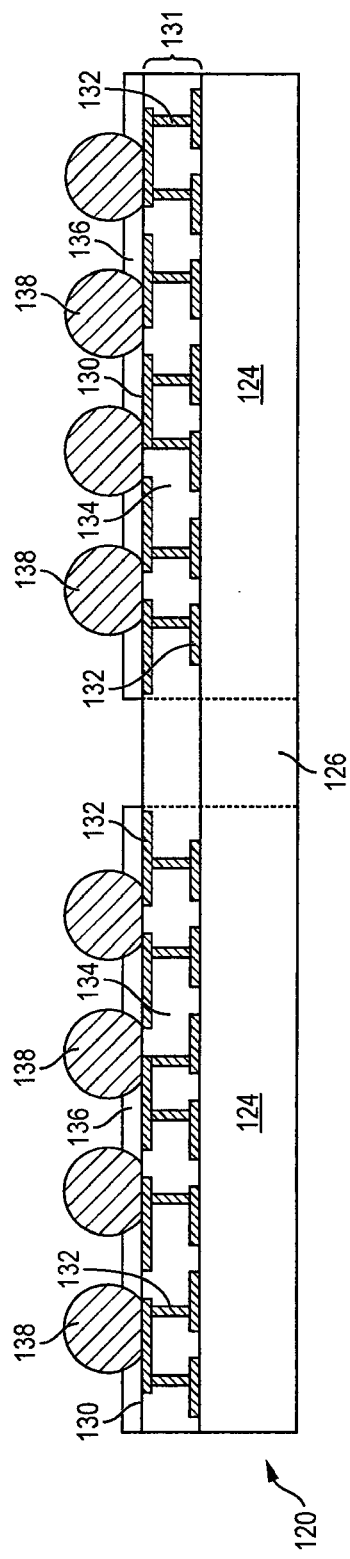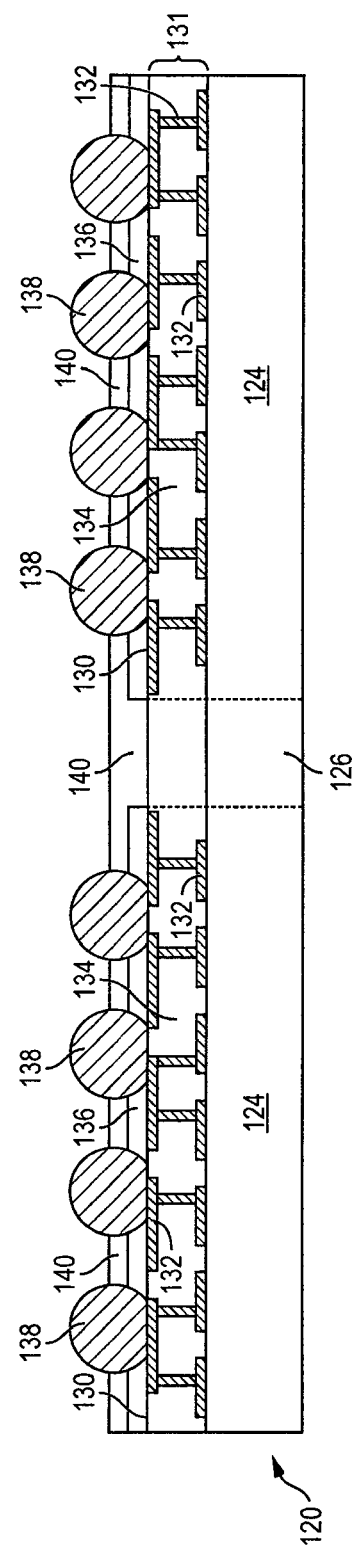

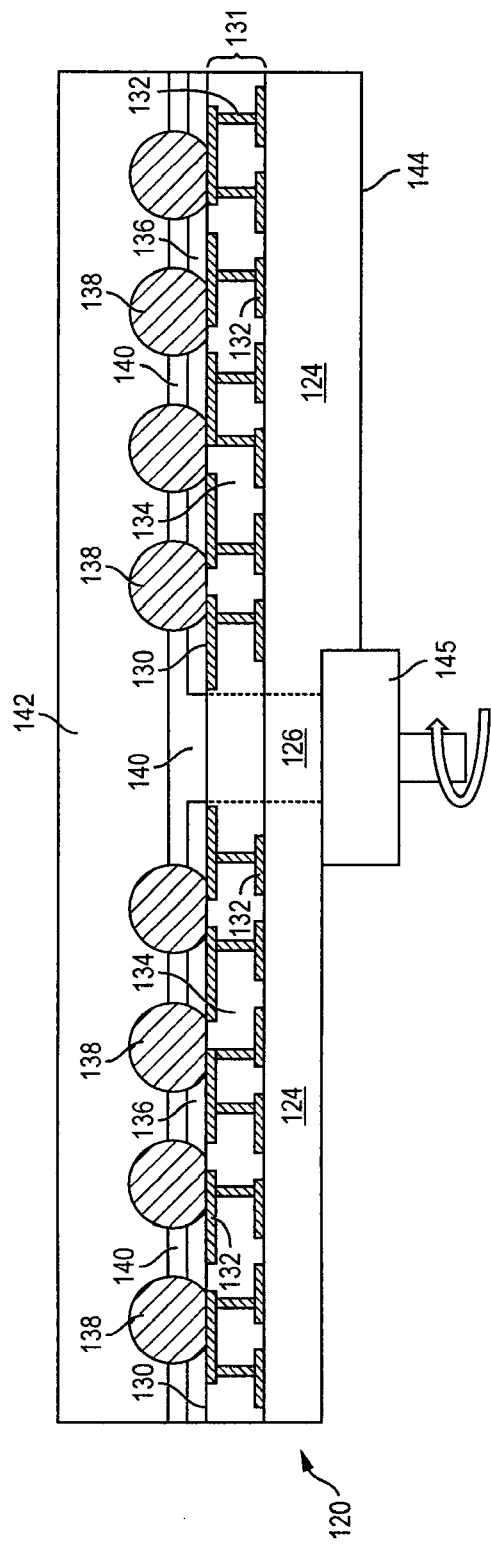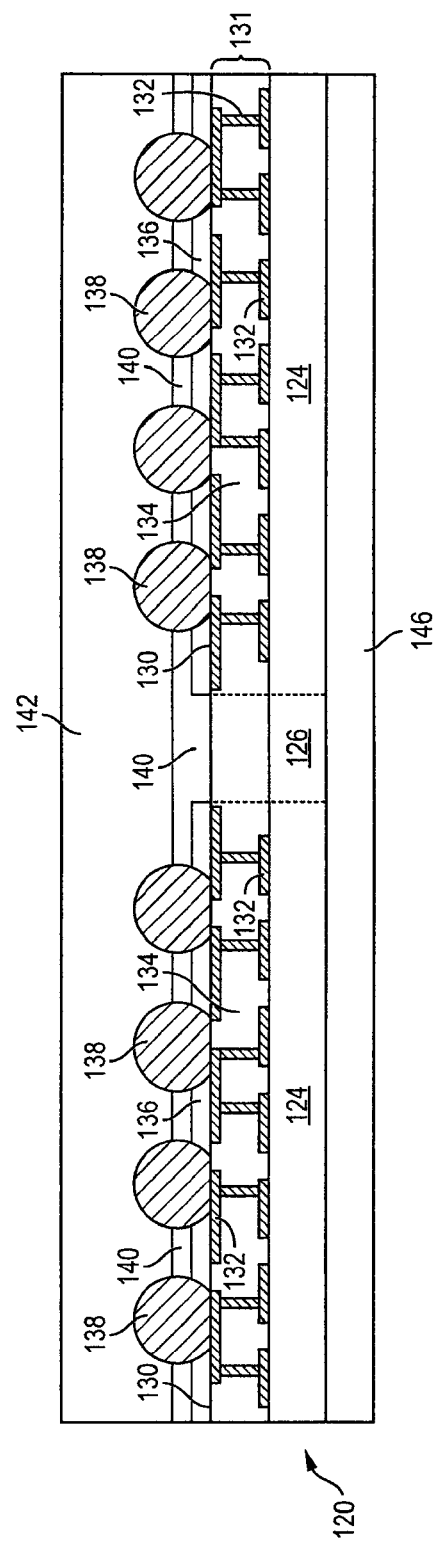

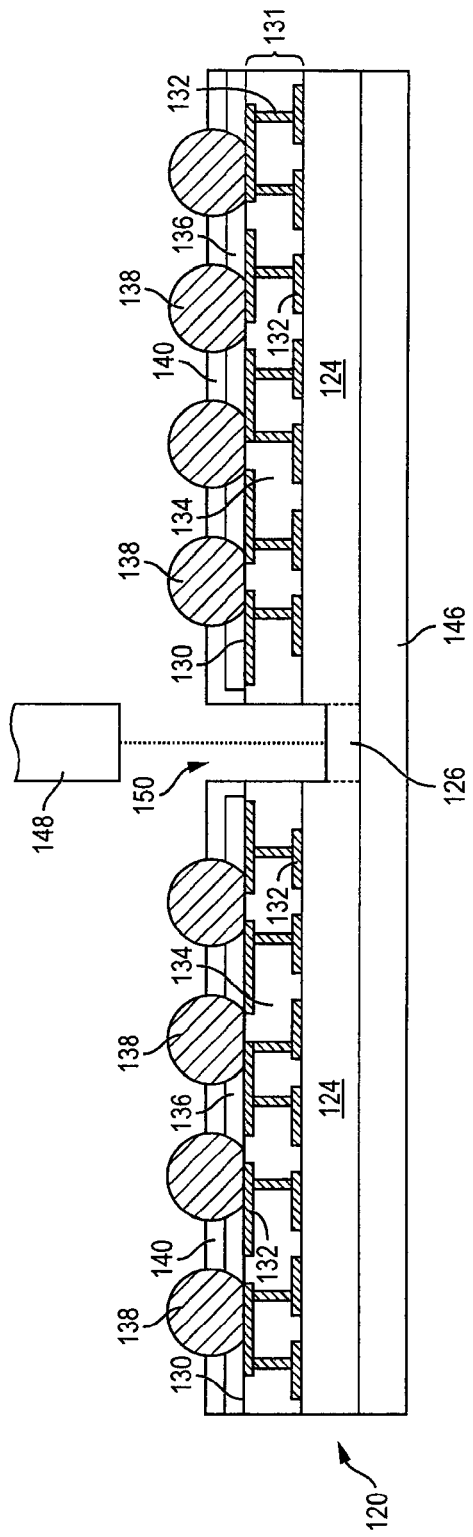
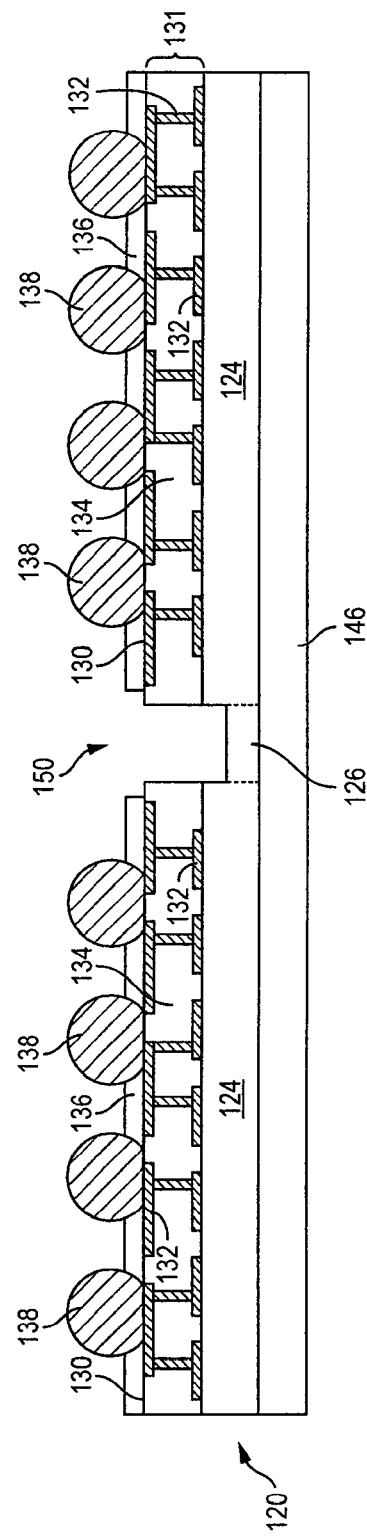
FIG. 4m
FIG. 4n

US 8,524,537 B2

SEMICONDUCTOR DEVICE AND METHOD OF FORMING PROTECTIVE COATING MATERIAL OVER SEMICONDUCTOR WAFER TO REDUCE LAMINATION TAPE RESIDUE

FIELD OF THE INVENTION

The present invention relates in general to semiconductor devices and, more particularly, to a semiconductor device and method of forming a protective coating material over a surface of a semiconductor wafer to reduce lamination tape residue.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1a shows a conventional semiconductor wafer 10 containing a base substrate material. A plurality of semiconductor die or components 12 is formed on wafer 10 separated by saw streets 14. A build-up interconnect structure 20 is formed over active surface 18 of semiconductor wafer 10. The build-up interconnect structure 20 includes a plurality of electrically conductive layers 22 separated by insulating or passivation layers 24. An insulating or passivation layer 28 is formed over build-up interconnect structure 20. A portion of insulating layer 28 is removed by an etching process to expose conductive layers 22 and saw street 14. A plurality of bumps 26 is formed over the exposed conductive layers 22. A lamination tape 30 is applied over the top surface of semiconductor wafer 10, i.e., insulating layer 28 and bumps 26, to provide structural support for the wafer during subsequent manufacturing processes. When lamination tape 30 is removed, a tape residue 34 is often left behind over insulating layer 28, particularly between bumps 26, as shown in FIG. 1b. FIG. 1c shows a top view of a portion of semiconductor wafer 10 with tape residue 34 remaining over insulating layer 28 and between bumps 26 after removal of lamination tape 30. Tape residue 34 reduces topside wafer quality and increases defects during inspection.

SUMMARY OF THE INVENTION

A need exists to reduce tape residue over the topside of a semiconductor wafer left behind after removing lamination tape. Accordingly, in one embodiment, the present invention is a method of making a semiconductor device comprising the steps of providing a semiconductor wafer containing a plurality of semiconductor die separated by a saw street, forming a build-up interconnect structure over an active surface of the semiconductor wafer, forming a first insulating layer over the build-up interconnect structure, forming a plurality of bumps over the build-up interconnect structure, depositing a protective coating material over the first insulating layer and saw street, applying a lamination tape over the protective coating material and bumps, removing a portion of a back surface of the semiconductor wafer opposite the active surface of the semiconductor wafer, applying a mounting tape over the back surface of the semiconductor wafer, removing the lamination tape while leaving the protective coating material over the first insulating layer and saw street, forming a first channel through the saw street extending through the build-up interconnect structure and partially but not completely through the semiconductor wafer, and removing the protective coating material after forming the first channel.

In another embodiment, the present invention is a method of making a semiconductor device comprising the steps of providing a semiconductor wafer containing a plurality of semiconductor die separated by a saw street, forming a first insulating layer over a first surface of the semiconductor wafer, depositing a protective coating material over the first insulating layer and saw street, applying a first support tape over the protective coating material, removing a portion of a second surface of the semiconductor wafer opposite the first surface of the semiconductor wafer, removing the first support tape while leaving the protective coating material over the first insulating layer and saw street, forming a first channel through the saw street extending partially through the semiconductor wafer, and removing the protective coating material after forming the first channel.

In another embodiment, the present invention is a method of making a semiconductor device comprising the steps of providing a semiconductor wafer containing a plurality of semiconductor die separated by a saw street, forming a first insulating layer over a first surface of the semiconductor wafer, depositing a protective coating material over the first insulating layer and saw street, applying a first support tape over the protective coating material, and removing the first support tape while leaving the protective coating material over the first insulating layer and saw street.

In another embodiment, the present invention is a semiconductor device comprising a semiconductor wafer containing a plurality of semiconductor die separated by a saw street. A first insulating layer is formed over a first surface of the semiconductor wafer. A coating material is deposited over the first insulating layer and saw street. A first support tape is applied over the protective coating material. The coating material protects the first insulating layer and saw street when removing the first support tape.

BRIEF DESCRIPTION OF THE DRAWINGS

FIGS. 1a-1c illustrate a conventional semiconductor wafer with topside lamination tape residue;

DETAILED DESCRIPTION OF THE DRAWINGS

Figure 1C:
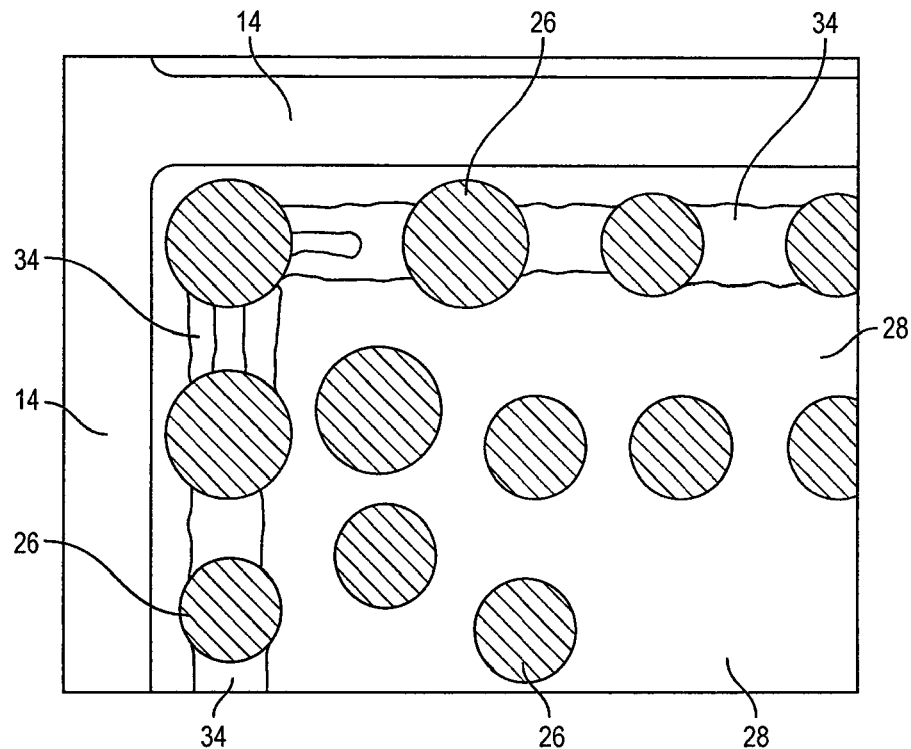

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
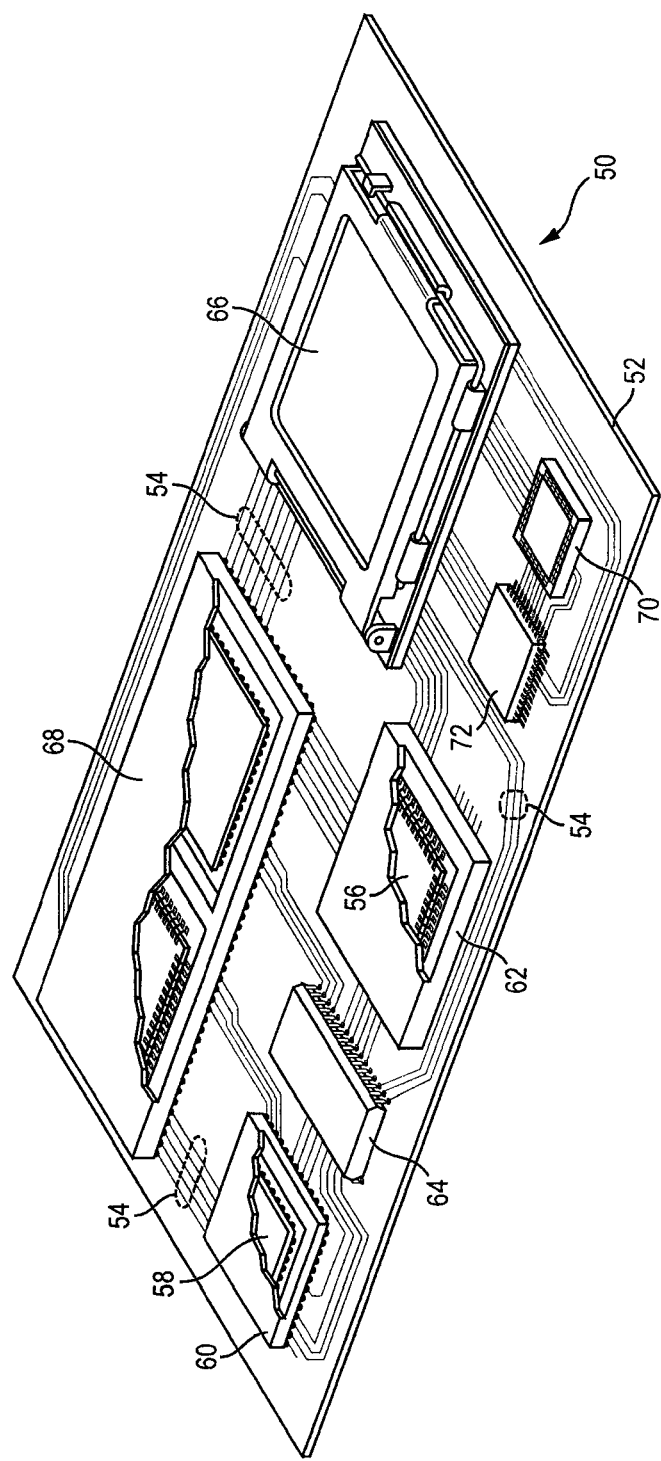
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
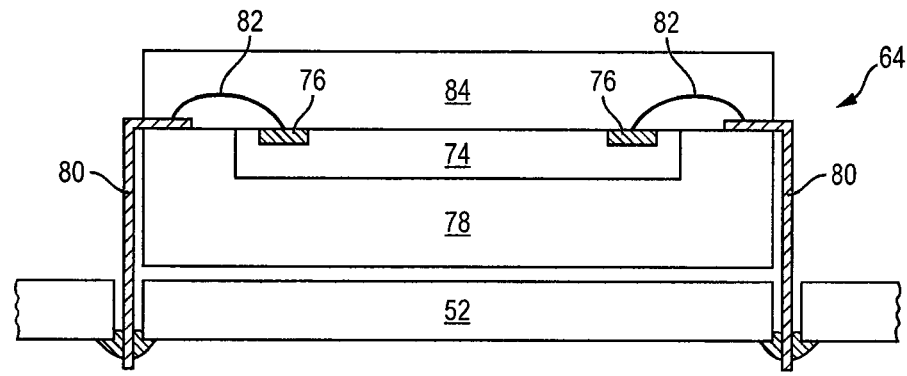
FIGS. 3a-3c illustrate further detail of the representative semiconductor packages mounted to the PCB.
Figure 3B:
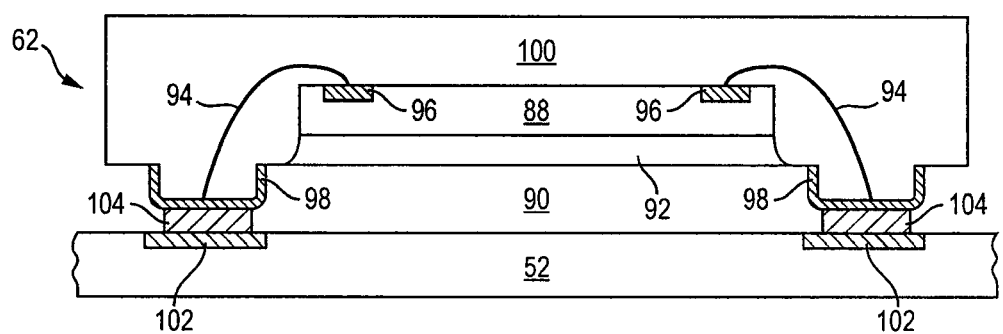
Figure 3C:
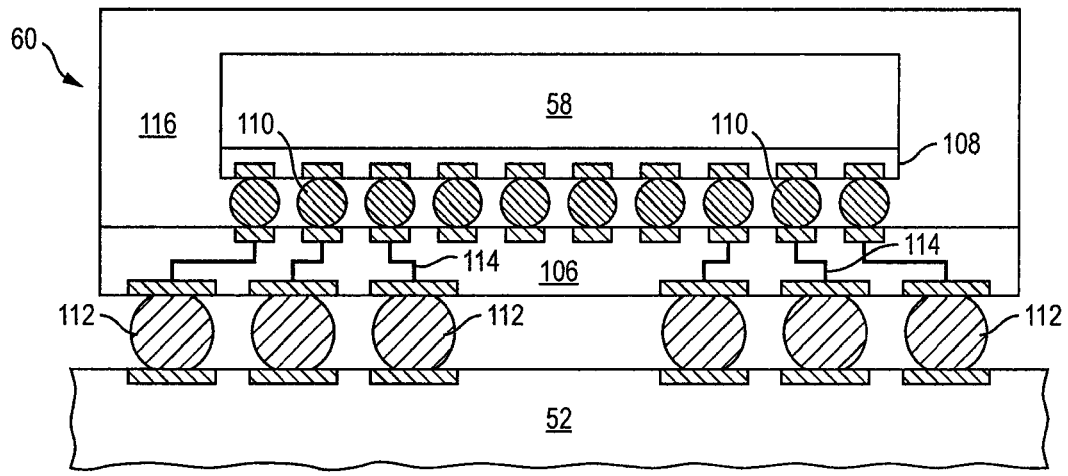

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
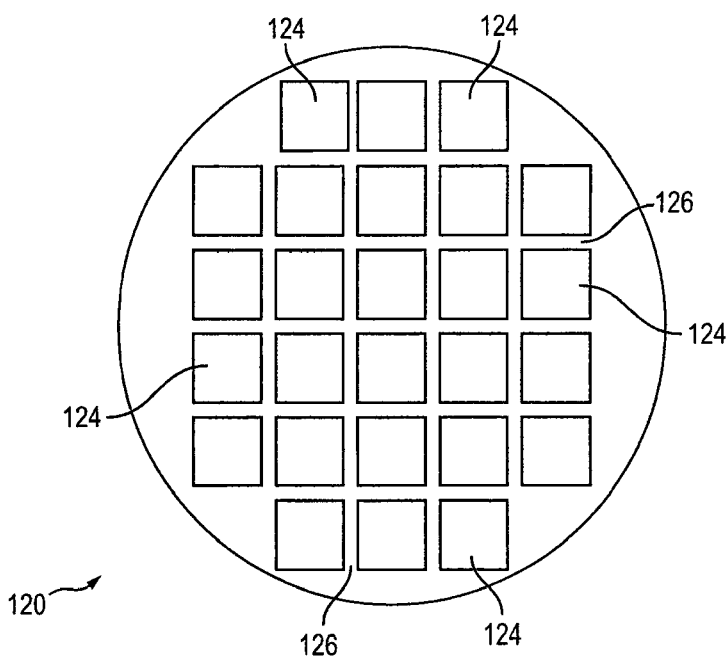
FIGS. 4a-4p illustrate a process of forming a protective coating material over a topside of a semiconductor wafer to reduce lamination tape residue.
Figures 4B, 4C, 4D:
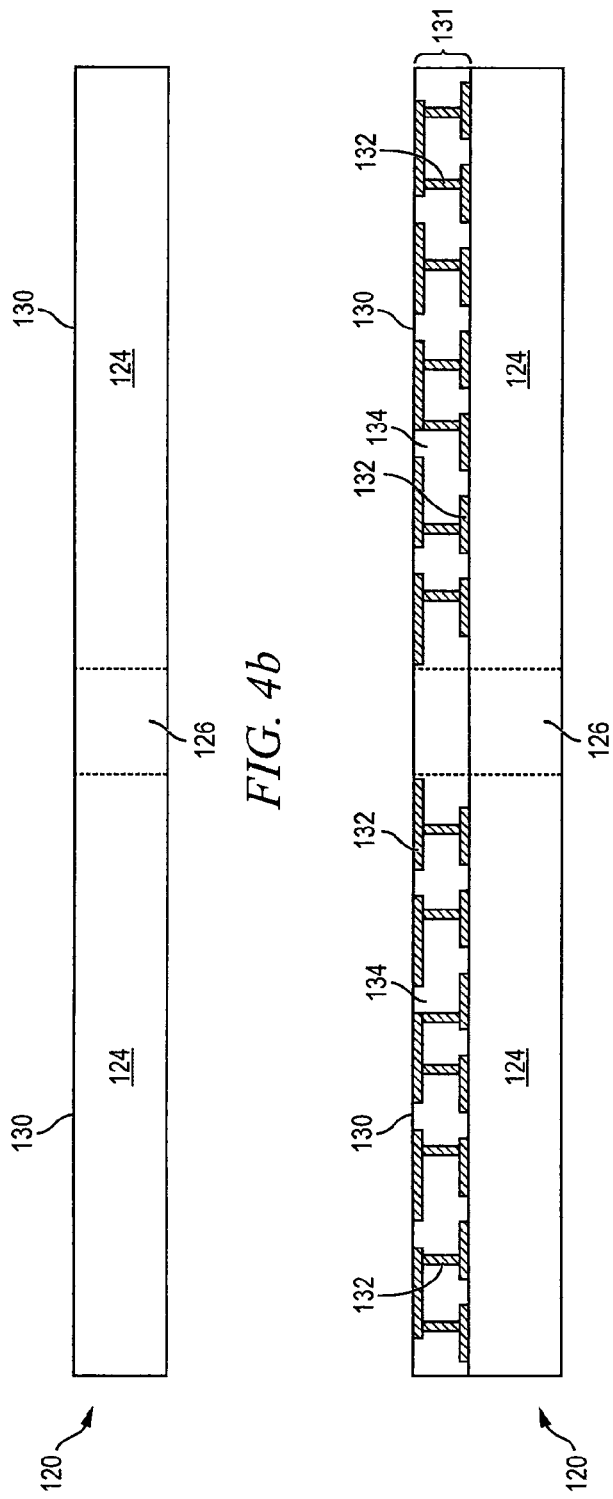
Figure 4G:
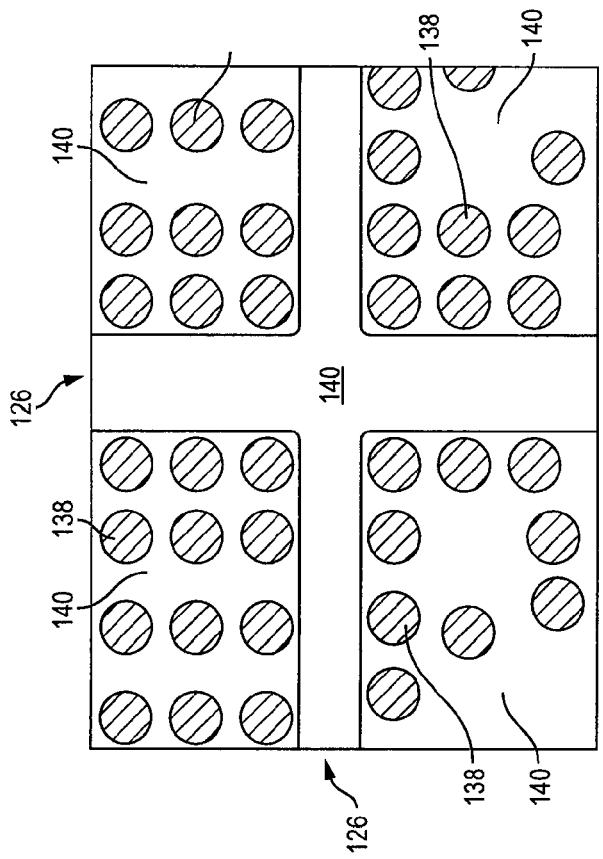
Figure 4H:
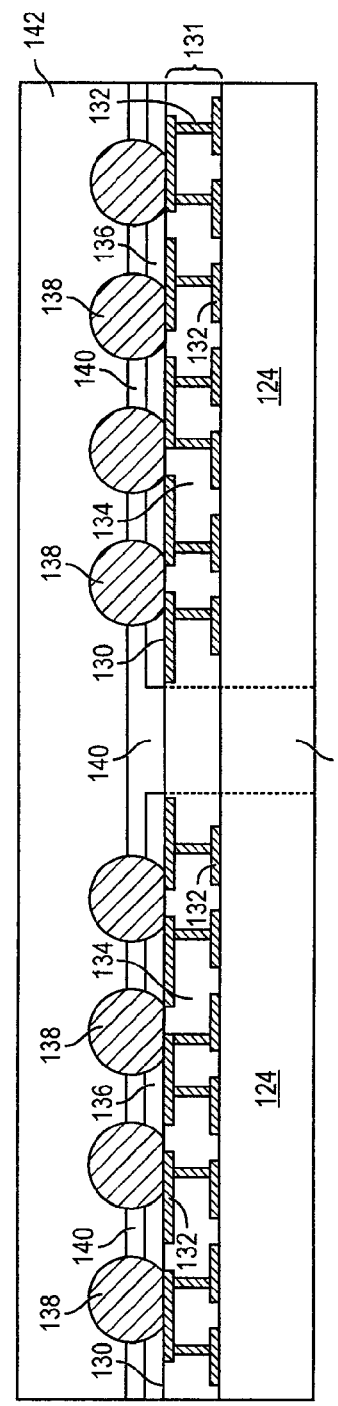
Figure 4K:
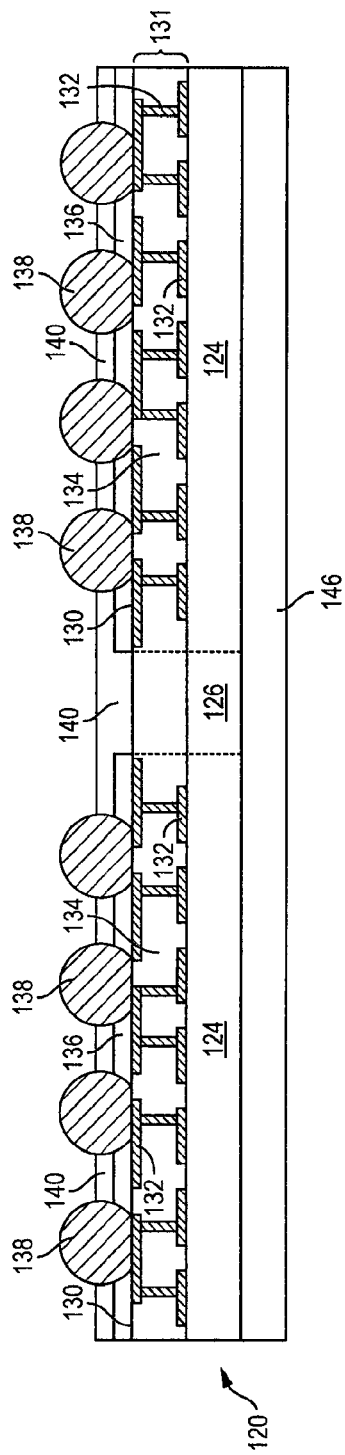
Figure 4L:
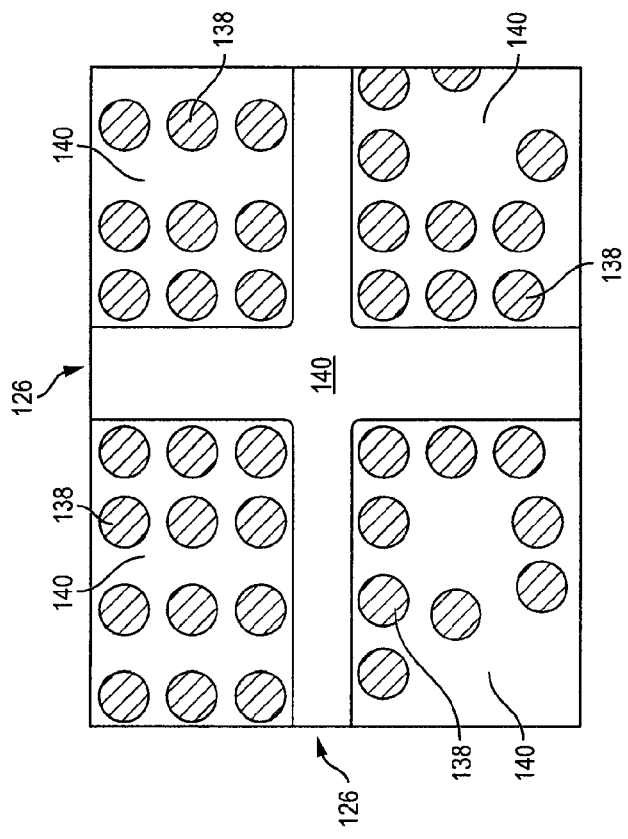
Figure 4O:
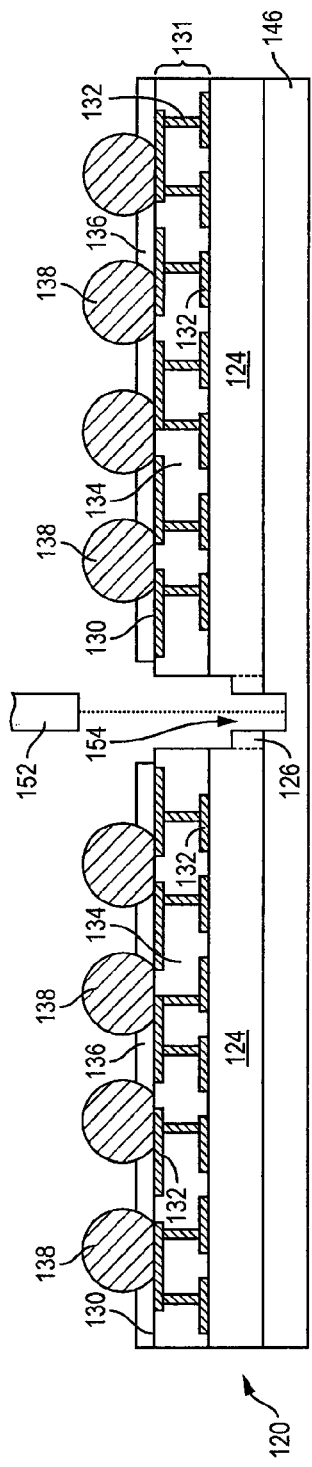
Figure 4P:
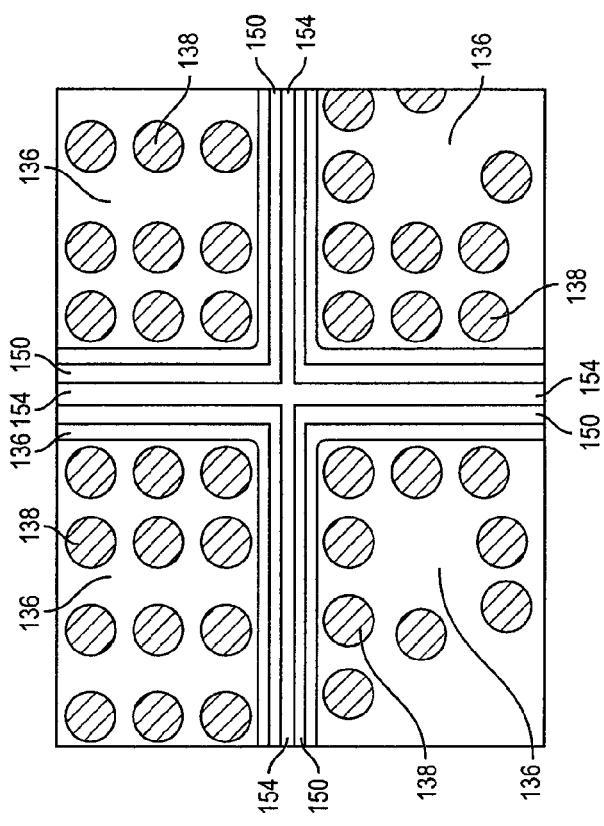

FIGS. 4a-4p illustrate, in relation to FIGS. 2 and 3a-3c, a process of forming a protective coating material over a surface of a semiconductor wafer to reduce lamination tape residue. FIG. 4a shows a semiconductor wafer 120 containing a base substrate material, such as silicon, germanium, gallium arsenide, indium phosphide, or silicon carbide, for structural support. A plurality of semiconductor die or components 124 is formed on wafer 120 separated by saw streets 126 as described above.

FIG. 4b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

In FIG. 4c, a build-up interconnect structure 131 is formed over active surface 130 of semiconductor wafer 120. The build-up interconnect structure 131 includes a plurality of electrically conductive layers 132 formed using PVD, CVD, electrolytic plating, electroless plating process, or other suitable metal deposition process. Conductive layers 132 can be one or more layers of Al, Cu, Sn, Ni, Au, Ag, or other suitable electrically conductive material. Conductive layers 132 provide electrical interconnect for the circuits on active surface 130.

A plurality of insulating or passivation layers 134 is formed between conductive layers 132 using PVD, CVD, printing, spin coating, spray coating, or thermal oxidation. The insulating layers 134 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

In FIG. 4d, an insulating or passivation layer 136 is formed over build-up interconnect structure 131 using PVD, CVD, printing, spin coating, spray coating, or thermal oxidation. The insulating layer 136 can be one or more layers of SiO2, Si3N4, SiON, Ta2O5, Al2O3, or other material having similar insulating and structural properties.

In FIG. 4e, a portion of insulating layer 136 is removed by an etching process to expose conductive layers 132 and saw street 126. An electrically conductive bump material is deposited over the exposed conductive layers 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 132 using a suitable attachment or bonding process. In one embodiment, the bump material is reflowed by heating the material above its melting point to form spherical balls or bumps 138. In some applications, bumps 138 are reflowed a second time to improve electrical contact to conductive layers 132. The bumps can also be compression bonded to conductive layers 132. Bumps 138 represent one type of interconnect structure that can be formed over conductive layers 132. The interconnect structure can also use bond wires, stud bump, micro bump, or other electrical interconnect.

FIG. 4f shows a protective coating material 140 deposited over the top surface of semiconductor wafer 120, i.e., over insulating layer 136 and saw streets 126 and between bumps 138, prior to application of lamination tape. The protective coating material 140 substantially covers saw street 126 and insulating layer 136 around bumps 138. Coating material 140 can be polyvinyl alcohol (PVA) or other water-soluble liquid formed using spin coating or spray coating. Coating material 140 protects the surface layers of semiconductor wafer 120, i.e., build-up interconnect structure 131 and active surface 130, during application and removal of lamination tape. FIG. 4g shows a top view of protective coating material 140 over semiconductor wafer 120, prior to application of lamination tape.

In FIG. 4h, a lamination support tape 142 is applied over the entire top surface of semiconductor wafer 120, i.e., over protective coating material 140 and bumps 138, to provide structural support for the wafer during subsequent manufacturing processes, such as backgrinding or other wafer thinning process. The lamination tape 142 includes a dielectric base film such as paper or polymer with adhesive layer having a coefficient of thermal expansion (CTE) selected similar to semiconductor wafer 120, e.g., $10 \times 10^{-6}$/K to $25 \times 10^{-6}$/K, to reduce warpage. The lamination tape 142 is releasable by ultraviolet (UV) light or heat.

In FIG. 4i, a back surface 144 of semiconductor wafer 120, opposite the active surface 130, undergoes a backgrinding operation using grinder 145 to remove excess bulk material and reduce the thickness of the wafer. After backgrinding, a mounting or dicing support tape 146 is applied to the back surface of semiconductor wafer 120, as shown in FIG. 4j. Mounting tape 146 includes a base film with adhesive layer releasable by UV light or heat.

In FIG. 4k, lamination tape 142 is removed by heat or UV light after mounting tape 146 is applied. FIG. 4l shows a top view of protective coating material 140 over semiconductor wafer 120, after removal of lamination tape 142. Note that after removal of lamination tape 142, there is little or no residual tape remaining on the surface due to protective coating material 140.

In FIG. 4m, semiconductor wafer 120 undergoes a first dicing operation using saw blade or laser cutting tool 148 to cut channel 150 through saw street 126. Channel 150 extends through protective coating material 140 and build-up interconnect structure 131 and partially but not completely through the bulk semiconductor material of wafer 120. In one embodiment, channel 150 extends substantially across the width of saw street 126.

In FIG. 4n, after channel 150 is formed, protective coating material 140 is removed by a cleaning and drying operation, for example using de-ionized water. After removing protective coating material 140, semiconductor wafer 120 undergoes a second dicing operation using saw blade or laser cutting tool 152 to cut channel 154 through saw street 126 to mounting tape 146, as shown in FIG. 4o. Channel 154 is narrower than channel 150. In one embodiment, channel 150 has a width of 20 micrometers (μm) and channel 154 has a width of 10 μm. Channel 154 extends through the bulk semiconductor material of wafer 120 and partially but not completely through mounting tape 146. FIG. 4p shows a top view of semiconductor wafer 120, after the dicing operation. After cutting channel 154, mounting tape 146 is removed by UV light or heat to singulated semiconductor wafer 120 into separate semiconductor die 124.

Figure 5:
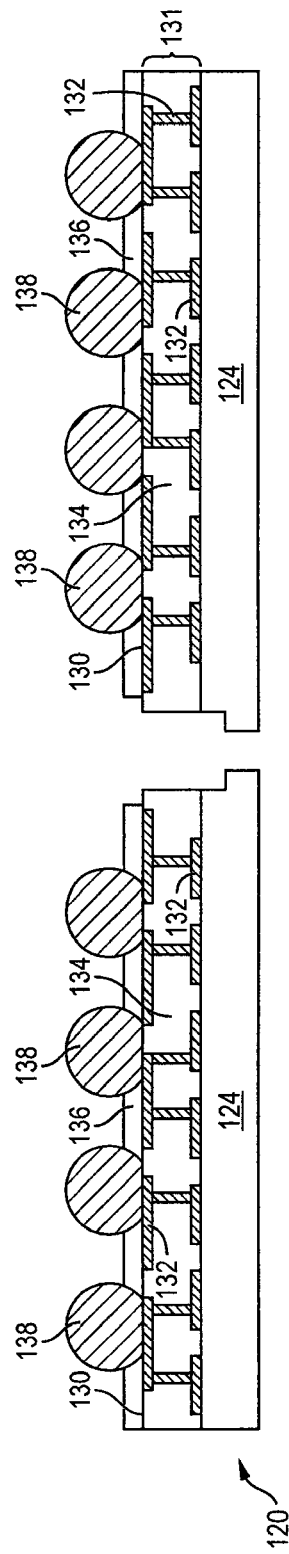
FIG. 5 illustrates a singulated semiconductor die with reduced lamination tape reduce.

FIG. 5 shows semiconductor die 124 following singulation. The protective coating material 140, which is deposited prior to application of lamination tape 142, reduces or eliminates tape residue, particularly around bumps 138, during removal of the lamination tape. The protective coating material 140 also prevents undesired thinning of insulating layer 136 during removal of lamination tape 142. The integrity of insulating layer 136 and build-up interconnect structure 131 is enhanced by protective coating material 140. Semiconductor die 124 has less contaminants or debris, as well as less chipping around active surface 130, build-up interconnect structure 131, and insulating layer 136, caused by the dicing operation.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer including a plurality of semiconductor die separated by a saw street;
   forming a build-up interconnect structure over a first surface of the semiconductor wafer;
   forming a first insulating layer over the build-up interconnect structure;
   forming a plurality of bumps over the build-up interconnect structure;
   depositing a protective coating material over the first insulating layer and the saw street;
   applying a lamination tape over the protective coating material and the bumps;
   removing a portion of a second surface of the semiconductor wafer opposite the first surface of the semiconductor wafer;
   removing the lamination tape while leaving the protective coating material over the first insulating layer and the saw street;
   forming a first channel through the saw street extending through the build-up interconnect structure and partially but not completely through the semiconductor wafer after removing the lamination tape; and
   removing the protective coating material after forming the first channel.

2. The method of claim 1, further including forming a second channel through the saw street extending completely through the semiconductor wafer, wherein the second channel is narrower than the first channel.

3. The method of claim 2, further including singulating the semiconductor wafer.

4. The method of claim 1, wherein the protective coating material reduces tape residue over the first insulating layer.

5. The method of claim 1, wherein forming the build-up interconnect structure includes:
   forming a plurality of conductive layers over the first surface of the semiconductor wafer; and
   forming a second insulating layer between the conductive layers.

6. The method of claim 1, wherein the protective coating material substantially covers the saw street and the first insulating layer around the bumps.

7. A method of making a semiconductor device, comprising:
   providing a semiconductor wafer;
   depositing a protective coating material over the semiconductor wafer;
   applying a first support tape over the protective coating material;
   removing a portion of a second surface of the semiconductor wafer opposite the first surface of the semiconductor wafer;
   removing the first support tape while leaving the protective coating material over the semiconductor wafer;
   forming a first channel extending partially through the semiconductor wafer; and
   removing the protective coating material after forming the first channel.

8. The method of claim 7, further including applying a second support tape over the second surface of the semiconductor wafer after removing the portion of the second surface of the semiconductor wafer.

9. The method of claim 8, further including forming a second channel extending completely through the semiconductor wafer and partially through the second support tape.

10. The method of claim 9, further including removing the second support tape to singulate the semiconductor wafer.

11. The method of claim 7, further including:
    forming a plurality of conductive layers over the first surface of the semiconductor wafer;
    forming an insulating layer between the conductive layers; and
    forming a plurality of bumps over the conductive layers.

12. The method of claim 7, further including:
    forming a build-up interconnect structure over the first surface of the semiconductor wafer; and
    forming an insulating layer over the build-up interconnect structure.

13. The method of claim 12, further including forming a plurality of bumps over the build-up interconnect structure.

14. A method of making a semiconductor device, comprising:
    providing a semiconductor wafer;
    depositing a protective coating material over the semiconductor wafer;
    applying a first support tape over the protective coating material;
    removing a portion of a second surface of the semiconductor wafer opposite the first surface of the semiconductor wafer;
    removing the first support tape while leaving the protective coating material over the semiconductor wafer; and
    removing the protective coating material.

15. The method of claim 14, further including forming a first channel extending partially through the semiconductor wafer.

16. The method of claim 15, further including forming a second channel extending completely through the semiconductor wafer.

17. The method of claim 16, wherein the second channel is narrower than the first channel.

18. The method of claim 16, further including singulating the semiconductor wafer.

19. The method of claim 14, wherein the protective coating material reduces residue over the semiconductor wafer after removing the first support tape.

20. The method of claim 14, further including:
    forming a plurality of conductive layers over the first surface of the semiconductor wafer; and
    forming an insulating layer between the conductive layers.

21. The method of claim 14, further including:
    forming a build-up interconnect structure over the first surface of the semiconductor wafer; and
    forming an insulating layer over the build-up interconnect structure.

22. The method of claim 21, further including forming a plurality of bumps over the build-up interconnect structure.

23. A method of making a semiconductor device, comprising:
    providing a semiconductor wafer;
    depositing a protective material over a first surface of the semiconductor wafer;
    forming a first channel extending partially through the semiconductor wafer; and
    removing the protective material after forming the first channel.

24. The method of claim 23, further including forming the first channel extending partially through the semiconductor wafer using a laser.

25. The method of claim 23, wherein the protective material further includes a water-soluble material.

26. The method of claim 23, further including:
forming a build-up interconnect structure over the first surface of the semiconductor wafer; and
forming an insulating layer over the build-up interconnect structure.

27. The method of claim 26, further including forming a plurality of bumps over the build-up interconnect structure.

28. The method of claim 23, further including:
applying a lamination tape over the protective material;
removing a portion of a second surface of the semiconductor wafer opposite the first surface of the semiconductor wafer; and
removing the lamination tape while leaving the protective material over the first surface of the semiconductor wafer.

* * * * *